United States Patent Office 3,579,339

Patented May 18, 1971

3,579,339

PHOTOPOLYMERIZABLE DISPERSIONS AND ELEMENTS CONTAINING NONMIGRATORY PHOTOREDUCIBLE DYES

Catherine Teh-lin Chang, New Brunswick, and Peter Walker, Red Bank, N.J., assignors to E. I. du Pont de Nemours and Company, Wilmington, Del.

No Drawing. Filed May 23, 1967, Ser. No. 640,496
Int. Cl. G03c *1/76, 3/00, 1/68*
U.S. Cl. 96—74 12 Claims

ABSTRACT OF THE DISCLOSURE

A photopolymerizable dispersion and layers comprising a continuous phase with an oragnic macromolecular polymer dispersion medium (e.g., gelatin) and a dispersed phase including an addition polymerizable ethylenically unsaturated compound (e.g., a monomer such as pentaerythritol triacrylate, and at least one of the ingredients of a color image-yielding composition (e.g., a photographic color former) in reactive association with a photoinitiator mixture comprising (a) a nonmigratory, photoreducible dye, e.g., Methylene Blue having the four methyl radicals replaced by butyl radicals, and (b) a free-radical producing agent, e.g., N-phenylglycine.

BACKGROUND OF THE INVENTION

Field of the invention

This invention relates to heterogeneous photopolymerizable compositions, layers and elements useful in the formation of colored images and comprising non-migratory photoreducible dyes as part of the photoinitiator system.

Description of the prior art

It is known that photopolymerization can be carried out in such a manner as to reproduce original text and pictorial matter. Practical applications of such a process have been disclosed, e.g., in the preparation of relief printing plates by wash-out of unpolymerized areas, thermal transfer of unpolymerized image areas, etc. In the compositions of the prior art, it is customary to employ homogeneous compositions wherein the polymerizable monomer, the photoinitiator, and the binder are all within a single phase. In such a single phase system it is known that severe inhibition of the polymerization reaction is caused by the presence of oxygen. It has been difficult to reproduce continuous tone images by photopolymerization of homogeneous compositions probably because of an oxygen inhibition effect.

In assignee's copending application of Thommes and Walker, Ser. No. 502,462, filed Oct. 22, 1965 U.S. Pat. 3,418,118, Dec. 4, 1968, there are disclosed heterogeneous photopolymerizable compositions which are less subject to the above discussed inhibiting effect of oxygen. Such compositions are coated to form both monolayer and multilayer elements useful in forming colored images. In forming images from the multilayer elements, there is some difficulty in preserving the desired spectral response of the individual layers due to migration of the photoinitiator.

SUMMARY OF THE INVENTION

The photopolymer dispersion of this invention comprises a continuous phase of an organic macromolecular polymer dispersion medium including a dispersed phase containing:

(1) At least one ethylenically unsaturated compound having a boiling point above 100° C. at normal pressure, being capable of forming a high polymer by free-radical initiated, chain-propagating addition polymerization, and (2) at least one of the ingredients of a color image-yielding composition, and in reactive association with ingredients (1) and (2), a free-radical generating photoinitiator composition comprising (a) a nonmigratory photoreducible dye that is more soluble in ingredient (1) than in said dispersion medium, and (b) a free-radical producing agent activated only by the excited state of said photoreducible dye.

Photopolymerizable elements of the invention comprise at least one layer of a coated dispersion as defined above on a suitable support.

In a preferred embodiment of the invention, ingredient (2) above is at least one ingredient or ingredients of a color former composition that is or are incapable alone of forming a color image upon photopolymerization of the layer.

The term, photoreducible dye, includes any of the known dyes that are capable of forming a stable system with a reducing agent in the dark but which will undergo reduction when irradiated with actinic radiation, including visible light, in the presence of the reducing agent. Suitable such dyes are defined in this manner in Oster U.S. Pat. 2,850,445, Sept. 2, 1958. Among the useful dyes are rose bengal, phloxine, erythrosine, eosine, fluorescein, acriflavine, rhodamine B, methyl violet, brilliant green, thionine, methyl orange, and riboflavine.

Nonmigratory photoreducible dyes are defined below in the test procedure of Example I.

DESCRIPTION OF THE PREFERRED EMBODIMENTS

In preparing a preferred photopolymerizable dispersion and layer, an aqueous solution or dispersion of a macromolecular organic polymer, e.g., an aqueous gelatin solution, is stirred under high shear during the addition of a non-aqueous phase comprising a solution of at least one addition polymerizable monomer, non-migratory photoreducible dye, and a color coupler in an organic solvent therefor, e.g., ethyl acetate. A free-radical producing agent, e.g., N-phenylglycine, is added to the original aqueous gelatin solution. To obtain good dispersions, effective surfactant such as an organic ester of phosphoric acid should be present. The surfactant can be admixed with the aqueous solution. Thickening agents (viscosity modifiers) to control the coating properties can be admixed with the solution. A single addition polymerizable monomer such as pentaerythritol triacrylate is often sufficient although a combination such as the aforementioned hydrophobic monomer with a hydrophilic monomer such as 1,6-hexamethylenebisacrylamide is useful.

The color image-yielding composition can include any combinations of ingredients which, through chemical action, are capable of producing or destroying a colorant, i.e., a dye or a pigment, or altering the absorption characteristics of a colorant in such a manner as to yield a color image corresponding to an exposure pattern. A preferred color image-yielding composition or system is that of color coupling development wherein a color former (or color coupler) reacts with a color developing agent after the latter has reacted with an oxidizing agent. At least one but not all of the three ingredients, i.e., color former, color developing agent or oxidizing agent, can be present in the photopolymerizable dispersed phase with the remaining ingredient(s) being present in the dispersion medium or in the processing solutions. The imagewise hardening of the dispersed phase droplets alters the rate of diffusion (either into or out of the droplets) of one or more of the ingredients of the color image-yielding system so that chemical reaction occurs preferentially in areas which are least exposed. For example, a nonmigratory color former, within the dispersed droplets, couples in the presence of molecules of a color developing agent and oxidizing agent diffusing from a processing solution into the droplets, preferentially in unexposed areas. When a multi-layer element is prepared, it is necessary to have in the dispersed phase of each layer a portion of the color image-yielding system which will form only the desired color for that particular layer. For example, if the different color couplers in each layer are the type which will react with the same developer to form their respective colors then the couplers must be in the dispersed phase. If the color formers react only with different developers to form their respective colors, then either the color-former or developer may be used in the dispersed phase.

The useful color formers include those normally used in integral color photographic silver halide film elements, made nonmigratory by having a polymeric form or by having a weighting group such as a long chain aliphatic group. The non-migratory photoreducible dyes are described below in detail with descriptions of the methods of synthesis employed to prepare them.

Other types of color image-yielding compositions or systems useful in accordance with this invention include diazonium salt plus azo dye coupler, leuco dye plus oxidizing agent, dye plus bleaching agent (wherein color is removed preferentially in unexposed areas), metachromatic dye plus reactive substrate, etc. In any such image-producing system, one of the ingredients must be present in the dispersed droplets and imagewise reaction occurs either (a) by differential diffusion of the ingredient out of the dispersed droplet or (b) by differential diffusion of a co-reacting ingredient into the dispersed droplet. Preferably, the processing solutions are aqueous; one of the reacting ingredients is readily diffusible in aqueous media while another reacting ingredient is relatively nonmigratory.

The composition may be coated on any suitable support, either opaque or transparent. After drying, the coating is given an imagewise exposure to light of a wave length to which the photoreducible dye is sensitive. Then the coating is processed in a solution containing a color developer, e.g., an alkaline solution of 4-amino-N-ethyl-N-(beta - methanesulfonamidoethyl) - m - toluidine sesquisulfate monohydrate. The coating is then treated in a solution of an oxidizing agent such as potassium persulfate which oxidizes the color developing agent so that the latter is able to couple with the color coupler to form a dye image. Dye is formed in the areas of relatively low exposure to light. In areas of heavier exposure, photopolymerization does occur to such an extent that the dye coupling reaction is either hindered or prevented altogether, depending on the extent of the exposure.

In a more preferred embodiment of this invention, multilayer (particularly 3-layer) coatings are made in which each layer is sensitive to light of a different portion of the visible spectrum. Each layer also contains a different color former so that it is possible to form full-color images. In the so-called "conventional" system, one layer contains a cyan color former and is sensitized with an initiator which responds to red light; another layer with a magenta color former contains an initiator sensitive to green light; while a third layer with a yellow color former contains an initiator sensitive to blue light. A number of other combinations of color formers and sensitivities are also useful and the invention may be extended to the additive as well as the subtractive color system. The present invention is concerned primarily with the use of nonmigratory photoreducible dyes as initiators for photopolymerization.

Each of the specific ethylenically unsubstituted compounds, initiators, supports, macromolecular polymer binding agents or organic polymer dispersion media and supports that are listed and described in Plambeck U.S. Pat. 2,760,863, Aug. 28, 1956, Burg and Cohen U.S. Pat. 3,060,025, Oct. 23, 1962 and in aforedescribed application Ser. No. 502,462 (U.S. Pat. 3,418,118, Dec. 24, 1968) which is a continuation-in-part of Ser. No. 461,199, filed June 3, 1965 can be used as the compounds, ingredients, supports, etc, specified above in making the compositions, layers and elements of this invention. The various color image-yielding systems of said applications also can be used in such aspects of the invention.

The preferred embodiment of the invention is limited in that the dispersed phase contains only a part of a color image-yielding system, the part being incapable of singularly forming a color image. A number of embodiments are involved, however, wherein the dispersed phase contains the components necessary for a complete color system. For example, Belgian Pat. No. 647,584 discloses elements having dispersed photosensitive droplets containing a complete color system consisting of N-vinyl carbazole and $CBr_4$ which react in unexposed areas to form a color image.

The invention will be further illustrated but is not limited by the following procedures for the preparation of non-migratory photoreducible dyes and examples wherein the dispersing media are the aqueous phases and the dispersed phases are non-aqueous. Similar results can be obtained if droplets of an aqueous phase are dispersed in a non-aqueous dispersion medium with suitable selections of non-aqueous processing solutions. The nonmigratory initiators can be made by four general methods:

(1) attachment to polymers,
(2) addition of long aliphatic hydrocarbon chains (e.g., an alkyl radical of about 5 to 20 carbon atoms)
(3) addition of several short hydrocarbon chains, and
(4) by polycondensation.

PROCEDURE A

N-hexadecyl-N,N',N'-trimethylthionine

A stirred mixture of 3 g. of Methylene Azure B (CI 52010),[1] 3 g. of hexadecylbromide, 3 g. of anhydrous sodium acetate, 200 ml. of methyl ethyl ketone (MEK) and 40 ml. of dimethylformamide was heated under reflux for 72 hours. Solvents were evaporated and the solid was dissolved in chloroform. The chloroform solution was washed with portions of water until fresh portions did not acquire a color. The solid dye from the chloroform solution was then purified by chromatography through a column of adsorption alumina (Fischer No. A–540) to give 150 mg. of dye containing a hexadecyl radical having $\lambda_{max}$ 643 m$\mu$ (in ethanol). The starting dye, Methylene Azure B, has $\lambda_{max}$ 630 m$\mu$ (in ethanol).

PROCEDURE B

N-hexadecyl-N',N'-dimethylphenosafranine

Safranine Bluish (CI Basic Violet 5) was alkylated with hexadecyl bromide under conditions similar to those described in Procedure A to yield the alkylated dye having $\lambda_{max}$ of 556 m$\mu$ in MEK (methyl ethyl ketone). Safranine Bluish had a $\lambda_{max}$ of 547 m$\mu$ in MEK.

PROCEDURE C

N,N,N',N'-tetra-n-butylthionine

The synthesis was based on that of F. Kehrmann, Ber. Deut. Chem. Ges. 49, 53–4 (1916). To a stirred solution of 4 g. of phenothiazine (0.02 mole) in 150 ml. of glacial acetic acid was added 200 ml. of 5% bromine in acetic acid over a period of 20 minutes. The reaction container

[1] Colour Index, 2nd edition, 1956, The Society of Dyes and Colourists, Dear House, Picadilly, Bradford, Yorkshire, Englnad, and the American Association of Textile Chemists and Colorists, Lowell Technological Institute, Lowell, Mass., U.S.A.

was cooled with water to 25° C. The solid phenothiazonium perbromide was filtered and washed with ethyl ether until free of bromine. It was then suspended in 100 ml. of 95% ethanol. With efficient stirring, a solution of 16 g. (0.124 mole) of di-n-butylamine in 80 ml. of ethanol was added over a period of 30 minutes. The color of the mixture changed rapidly to bright blue. The solvent was evaporated at room temperature and atmospheric pressure. The crude dye was extracted with ether, then with n-hexane to remove the amine bromide formed during the reaction. The dye was recovered from ethyl acetate and weighed 360 mg. Further purification of the dye may be achieved by column chromatography through alumina or by paper chromatography (K. B. Taylor, Stain Technology, 36, 73–83 (1961).

PROCEDURE D 3,7-di-(N-piperidino)-phenazathionium bromide

Procedure C was carried out except for a replacement of di-n-butylamine by piperidine.

PROCEDURE E 3,7-di-(N-azabicyclo-[3,2,2]-nonyl)-phenazathionium bromide

Procedure C was carried out except for a replacement of di-n-butylamine by azabicyclo [3,2,2]nonane.

PROCEDURE F

N,N,N',N'-tetra-n-heptylthionine

Procedure C was repeated except for replacement of di-n-butylamine by di-n-heptylamine.

PROCEDURE G

N,N'-dimethyl-N,N'-dioctylthionine

Procedure C was repeated except for replacement of di-n-butylamine by di-n-heptylamine.

PROCEDURE H

Poly[3,7-di-N,N'-(1,3-di-4-piperidylpropane)-phenazathionium bromide]

This polymeric dye was produced by the method of Procedure C, substituting 1,3-di-4-piperidylpropane for di-n-butylamine.

PROCEDURE I

Poly[3,7-di-N,N'-diethylhexanediamine-1,6)-phenazathionium bromide]

This polymeric dye was also prepared according to the method of Procedure C, substituting N,N'-diethylhexanediamine-1,6 for di-n-butylamine.

The dyes of Procedures H and I are different from other polymeric dyes in that they are products of polycondensation, the dye units being linked together by short hydrocarbon chains. The spectra of these dyes show $\lambda_{max}$ at 670 m$\mu$ (in ethanol) and a shoulder peak at 620 m$\mu$, the intensity of which is considerably higher than those of the ordinary thiazine dyes. The degree of aggregation of the dye molecule must be higher in these polymeric dyes. Variation of the hydrocarbon chains in the diamines offers a useful means of controlling solubility characteristics of the polymeric dyes.

PROCEDURE J

N-decyl-N,N',N'-trimethylthionine

This direct synthesis of a thiazine dye is representative of a general method for making unsymmetrical thiazines. An N,N-dialkyl-p-phenylenediamine and an N,N-dialkylaniline are condensed by oxidation in the presence of a sulfur containing compound.

N-methyl-N-decylaniline was prepared according to the procedure of Breusch and Baykut, Rev. Faculte Sci. Univ. Istanbul, 16A, 221–5 (1951) Chem. Abstr. 47, 3257g (1953). A mixture of 1 mole of 1-bromodecane, 1 mole of N-methylaniline and 200 ml. of 95% ethanol was heated under reflux for 4 hrs. Ethanol was evaporated and the viscous residue was treated with 100 ml. 50% KOH. The organic materials were extracted with ether and distilled under vacuum through a Vigreaux column (8 in. long). The boiling point was 128–130° C. at 0.5 mm. with a yield of 70%. A solution of N-methyl-N-decylaniline and of commercially available N,N-dimethyl-p-phenylenediamine in 1 normal HCl was oxidized in the presence of $H_2S$ by alternate additions of 1 M $FeCl_3$ (in 2 N HCl) and 1 M aqueous $Na_2S$ (4 mole-equiv. $FeCl_3$ per 1 mole-equiv. $Na_2S$). The dyes were salted out by addition of NaCl. The dried residue was extracted with ethyl ether and $CS_2$ to remove sulfur and other impurities. The dyes were recovered from methanol solutions.

Four similar dyes were prepared in which the decyl radical was replaced by butyl, hexyl, octyl, and dodecyl. Respectively, these dyes were synthesized according to the above procedure by replacing the N-methyl-n-decylaniline by the butyl, hexyl, octyl, and dodecyl analogues which in turn were prepared by the Breusch and Baykut procedure above in yields, respectively, of 42%, 68%, 69% and 77%. The boiling points, respectively, were 105.5–106° C. at 9 mm., 126–129° C. at 10 mm., 122–125° C. at 1.25 mm., and 180° C. at 2.5 mm.

PROCEDURE K

N,N,N',N'-tetramethyl-4'-dodecylphenosafranine

A general procedure was based on that of H. Wieland, Ber. 53B, 1313–28 (1920). A cold solution of 0.25 mole of N.N-dimethyl-p-phenylenediamine, 0.25 mole N,N-dimethylaniline, 120 ml. concentrated HCl in 600 ml. $H_2O$ was added to a cooled stirring solution of 24 g. of potassium dichromate in 500 ml. of $H_2O$. The temperature of the reaction mixture was kept below 10° C. Zinc chloride, 150 g., was then added to the mixture. A green precipitate formed and was filtered. It was dissolved in warm water, and the solution was filtered into a solution containing 25 g. of sodium dithionite, 25 g. of potassium hydroxide, 80 ml. of conc. ammonia and 100 ml. of $H_2O$. The green color disappeared and a precipitate formed. It was filtered and washed with water. The 4,4'-bis-(dimethylamino)diphenylamine was obtained in 34% yield, M.P. 110–115° C. (recrystallized from hot water).

A mixture of 0.015 mole of 4,4'-bis(dimethylamino)-diphenylamine, 0.015 mole of p-dodecylaniline, 5 ml. of $H_2O$ and 50 ml. of glacial acetic acid was heated in a water-bath at 80° C. with stirring. A sample of 3 g. of manganese dioxide was added in small portions. After two hours, an additional 2 g. of $MnO_2$ was added to the reaction mixture. At the end of the fourth hour, the mixture was filtered while hot into 200 ml. of water containing 40 g. of KCl. A purple-red solid precipitated. The crude dye was purified through continuous extraction (in a Soxhlet extractor) with ether over a column of activated alumina. The dye was recovered from a methanol solution and had $\lambda_{max}$ in ethanol of 560 m$\mu$.

PROCEDURE L

N,N,N',N'-tetra-n-butyl-phenosafranine

The general method of Procedure K was followed, reacting N,N-dibutyl-p-phenylenediamine and N,N-dibutylaniline to form 4,4'-bis-(dibutylamino)-diphenylamine. The latter was reacted with aniline to form the dye named above.

The N,N-dibutyl-p-phenylenediamine was prepared by nitrosation and subsequent reduction. Thus, a cooled solution of 0.05 mole of N,N-dibutylaniline in 20 g. conc. HCl was mixed with 50 g. of crushed ice. To the mixture was added a solution of 0.055 mole of sodium nitrite in $H_2O$ over a period of 15 min. The nitroso compound was then reduced by addition of an excess of zinc powder in small portions. The solution of N,N-dibutyl-p-phenylenediamine was filtered from the excess zinc powder.

PROCEDURE M

N,N,N′,N′-tetra-n-butyl-4′-n-butylphenosafranine

Procedure L was repeated except that, in the final reaction, aniline was replaced by n-butylaniline.

PROCEDURE N

N,N,N′,N′-tetra-n-propyl-4′-dodecylphenosafranine

Procedure L was essentially repeated except for replacing butyl derivatives with the corresponding propyl derivatives and, in the final reaction, replacing aniline with p-dodecylaniline.

PROCEDURE O

N,N,N′,N′-tetramethyl-4′-tritylphenosafranine

Procedure K was essentially repeated except, in the final reaction, p-dodecylaniline was replaced by p-tritylaniline.

PROCEDURE P

N-(copolymer of methyl methacrylate and glycidyl methacrylate)-N,N′,N′-trimethylthionine A 1:1 compolymer of methyl methacrylate and glycidyl methacrylate was prepared by solution polymerization in methyl ethyl ketone (MEK) using azobisisobutyronitrile as the initiator. Polymerization was carried out under reflux for 20 hrs. Afterwards the solid polymer was obtained by evaporation, and dissolved in MEK to form a 20% by wt. solution.

A mixture of 0.5 g. of Methylene Azure B (CI 52010), 15 g. of the solution of copolymer prepared as above (20% by wt.), 100 ml. of methyl ethyl ketone, and 50 ml. of water was heated under reflux for 41 hrs. The mixture was cooled and treated with 5 ml. of 1 N HCl. The solvents were evaporated and the residue was washed with water until only silghtly colored. The solid was then redissolved in methyl ethyl ketone and reprecipitated from water twice yielding the polymeric dye as a dark blue powder. The dye thus acted as a curing agent for an epoxy resin.

PROCEDURE Q

N-(copolymer of methyl methacrylate and glycidyl methacrylate)-N′,N′-dimethylphenosafranine Procedure P was repeated except that the dye employed was Safranine Bluish (CI 50205).

PROCEDURE R

N-(copolymer of methyl methacrylate and glycidyl methacrylate)-8-methyl-7-diethylaminophenoxazine Procedure P was repeated except for use of Brilliant Cresyl Blue (CI 51010) as the dye.

PROCEDURE S (Copolymer of methyl methacrylate and glycidyl methacrylate)-2′,4′,5′,7′-tetraiodinate - 4,5,6,7 - tetrachlorofluorescein ester Procedure P was repeated except for the use of Rose Bengal (CI Acid Red 94) as the dye.

PROCEDURE T

N-(copolymer of methyl methacrylate and glycidyl methacrylate)-2,7-dimethyl-3,6-diaminoacridine Procedure P was repeated except for the use of Acidine Yellow (CI 46025) as the dye.

The nonmigratory dyes of the foregoing procedures have the following respective structures given below, the identifying letters of which correspond to the procedures:

Dye A

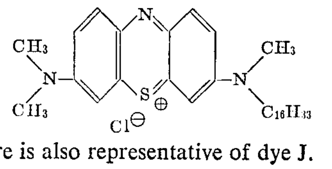

This structure is also representative of dye J.

Dye E

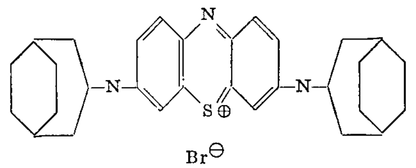

The rings on the right and left have saturated carbon atoms with hydrogen atoms attached thereto. This structure is representative of dyes C to G, inclusive.

Dye H

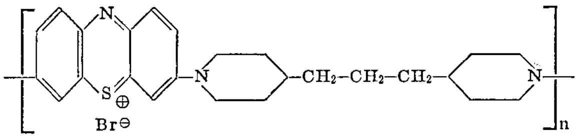

*n* is the number of recurring units in the polymer.

The unfused heterocyclic nitrogen rings have saturated ring carbon atoms with hydrogen atoms attached thereto.

Dye I

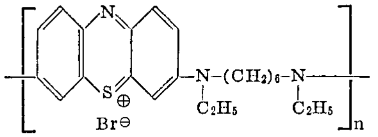

*n* is the number of recurring units in the polymer.

Dye K

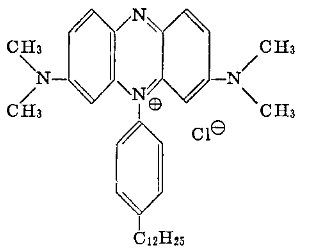

This structure is representative of Dyes K to O, inclusive.

Dye P

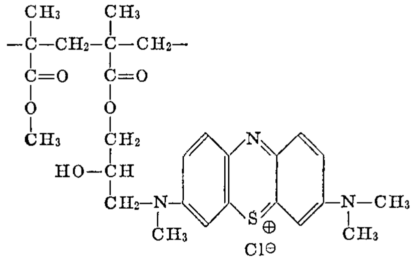

This structure is representative of Dyes P to T, inclusive.

The invention will be further illustrated by but is not intended to be limited to the following examples:

EXAMPLE I

Each of the dyes made according to the above procedures was tested to determine the degree of its nonmigratory nature. From other work it was determined that the dye of Procedure D, 3,7-di-(N-piperidino)-phenothiazine, was borderline for suitability in multilayer coatings. As an arbitrary definition, dyes will be considered as "nonmigratory" if they are superior in this property to the dye of Procedure D. To be superior, a dye should have a smaller migratory diameter according to the following test wherein the set gelatin was originally obtained from 5% by weight aqueous bone gelatin having an isoelectric point of about 4.8.

A sample of two micro-leters of a dye solution (approx. $1 \times 10^{-3}$ M in methanol) was placed on a layer of set gelatin, 0.5 cm. in thickness, using a microsyringe. The gelatin plate was then placed in a container and maintained in an atmosphere of saturated water vapor for 18 hrs. at 25° C. Diameters of the dyes are listed below along with the diameters of two (control) dyes which contain no weighting groups to prevent their migration.

| Dyes: | Diameter of dye circle, cm. |
|---|---|
| Procedure D (Control) | 1.2 |
| Methylene Blue (CI Basic Blue 9) | 1.6 |
| Safranine Bluish (CI Basic Violet 5) | 2.0 |
| Procedures— | |
| A | 0.5 |
| B | 0.6 |
| C | 0.5 |
| E | 0.8 |
| F | 0.3 |
| G | 0.3 |
| H | 0.3 |
| I | 0.3 |
| J | 1.1 |
| K | 0.4 |
| L | 0.7 |
| M | 0.4 |
| N | 0.3 |
| O | 0.3 |
| P | 0.3 |
| Q | 0.3 |
| R | 0.3 |
| S | 0.3 |
| T | 0.3 |

EXAMPLE II

An aqueous phase comprised:

Gelatin—18 g.
Gum arabic 10% by wt. aq. sol.—10 ml.
Water—300 ml.
N-phenylglycine—500 mg.

An oil phase comprised:

Ethyl acetate—40 ml.
Benzyl alcohol—0.5 g.
Organic ester of phosphoric acid (surfactant[1])—0.2 g.
N,N,N',N'-tetra-n-butylthionine (dye of Preparation C)—50 mg.
Pentaerythritol triacrylate—5.0 g.
Cyan color coupler (1.5:1 copolymer of ethyl acrylate and 1 - hydroxy-N-(β-vinyloxyethyl) 2-naphthamide color coupler monomer prepared as in Procedure A of Umberger, U.S. 3,299,013)—2.0 g.

[1] QS-44, Rohm & Haas Co.

The above aqueous phase was agitated in a high-speed liquid blender for 30 sec. followed by addition of the oil phase, with further blending for 90 sec. The temporary solvent, ethyl acetate was then removed by evaporation at 40° C. under reduced pressure. Total weight of the emulsion was made up to 350 g. by the addition of water.

This photopolymerizable emulsion was then skim coated (under safe light conditions) at 90° F. on a 0.004 inch thick polyethylene terephthalate film support bearing a thin gelatin layer over a subcoat of a copolymer of vinylidene chloride/methyl acrylate/itaconic acid disclosed in Example IV of Alles, U.S. 2,779,684. The coating was dried and an approximately 0.0004 inch thick photopolymerizable layer resulted. The dried coating was exposed by contact printing thru a square-root-of-two photographic step wedge. The light source was a 500-watt tungsten projector (Kodak Readymatic 500) at a distance of 13 in. for 2 min.

The exposed film was soaked in water for two minutes, treated for 30 seconds in developer solution, treated for 30 seconds in an oxidizing bath (2.0% by weight aqueous solution of potassium persulfate), and rinsed with water. The process was then repeated with a 30 second treatment in the developer solution, a 30 second treatment in the oxidizing bath, and a final water wash. The color developer had the following composition:

Sodium hydroxide, 5% aqueous soln.—100 ml.
Polyethylene oxide surfactant, Av. M.W. 4000—10 ml.
Sodium sulfite—1.0 g.
Benzyl alcohol—5.0 ml.
Color developing agent, 4-amino-N-ethyl-N-(β-methanesulfonamidoethyl) - m - toluidine sequesulfate monohydrate—10.0 g.
Water to 1 liter.

The dried film contained a cyan positive image of the stepwedge with the dye having developed to the highest density in areas of least exposure. In areas of higher exposure, photopolymerization interfered with the formation of the color image.

EXAMPLE III

Example II was followed but was modified by replacing the 2 grams of cyan color former with 1.0 gram of a magenta color former. Other changes in the composition of the oil phase were increasing the ethyl acetate from 40 to 80 ml., increasing the monomer (pentaerythritol triacrylate) from 5 to 8 g. and the addition of 1.0 g. of 1,6-hexamethylenebisacrylamide, 1.0 g. of N-allylmethacrylamide and 0.5 g. of a photocrosslinkable polymer. Also, the non-migratory photoreducible dye of Example II was replaced by 200 mg. of N,N,N,'N'-tetramethyl-4'-dodecylphenosafranine as prepared in Procedure K which had a peak in the green region of the visible spectrum. After coating, exposing, and processing as described in Example II, a positive magenta image was obtained.

The magenta color former of this example was a copolymer of 3.4 moles of methyl methacrylate per mole of the magenta color-forming monomer, 1-phenyl-3-methacrylamido-5-pyrazolone, prepared similarly to the procedure of Firestine and Umberger, U.S. Pat. 3,163,625. The photocrosslinkable polymer was a 1:1:1 copolymer (mole basis) of methyl methacrylate, acrylontrile, and glycidyl methacrylate reacted with acrylic acid to acrylate the glycidyl group.

EXAMPLE IV

The most striking advantage in the use of the nonmigratory photoreducible dyes of this invention was observed in making 2-layer coatings (cyan overcoated with magenta) and comparing them with similar coatings in which the photoreducible initiator dyes had not been made non-migratory.

A cyan monolayer coating as described in Example II was overcoated with the magenta dispersion of Example III. Both of these dispersion layers contained nonmigratory photoreducible dyes.

A control coating was prepared in a similar manner but replacing the non-migratory photoreducible initiator dyes with similar dyes which had not been rendered nonmigratory. Thus the photoreducible initiator dye for the cyan dispersion was Methylene Blue (CI Basic Blue 9) while, for the magenta dispersion, the photoreducible dye was Safranine Bluish (CI Basic Violet 5).

Both coatings were exposed and processed as described in Example II. A very poor image was obtained with the control coating because of the migratory nature of the photoreducible initiator dyes. In contrast, the coating containing the nonmigratory dyes showed clear separation of the red and green records so that a cyan dye image was formed in areas exposed to green light while a magenta dye image was formed in areas exposed to red light.

EXAMPLE V

A complete multilayer color film element was prepared in which the inner layer (adjacent to the support) was red sensitive and contained a cyan color former, the middle layer was green sensitive and contained a magenta color former, and the outer layer was blue sensitive and contained a yellow color former.

The cyan emulsion was related to that of Example II, differing only in that the photoreducible initiator dye of Procedure C was increased from 50 to 70 mg.

The magenta dispersion differed from that of Example III in that 2 ml. of glycerol were added to the aqueous phase; in the oil phase, the ethyl acetate was reduced from 80 to 40 ml., the pentaerythritol from 8 to 5 g., the photoreducible dye was reduced from 130 to 60 mg., and the N-allylmethacrylamide was omitted.

In preparing the yellow color coupler dispersion, the aqueous phase was similar to the aqueous phase of the magenta emulsion except for the addition of 2 g. of a crosslinking monomer, hexahydro - 1,3,5 - triacryllyl-s-triazine, made according to procedure of Gradsten and Pollock, J. Am. Chem. Soc. 70, 3079 (1948). The oil phase had the following composition:

Ethyl acetate—80 ml.
Benzyl alcohol—0.5 ml.
Pentaerythritol triacrylate—15 g.
Phenanthrenequinone—200 mg.
Yellow color coupling polymer [1]—3 g.
Photocrosslinkable polymer as in Example III—1 g.
Surfactant (organic ester of phosphoric acid)—0.2 g.

[1] 1.5:1 copolymer of 2-ethylhexyl acrylate and the yellow color coupling monomer, 2-methoxy-5-methacrylamido-(α-benzoyl)-acetanilide, prepared as described in Example I of assignee's copending application of Umberger, Ser. No. 510,965 filed Dec. 1, 1965, U.S. Pat. 3,451,820, June 24, 1969.

The dispersion was prepared as in the preceding examples although only about half of the ethyl acetate was evaporated. The total weight was brought up to 350 g. by the addition of water.

The 3 dispersions were coated in the order described earlier, both on the photographic film support of Example II and on a similar film support which had been made opaque by the inclusion of $TiO_2$ pigment prepared as described in Milner, U.S. Pat. 3,091,535. On the opaque support, the yellow dispersion was coated twice so that a higher yellow image density could be developed.

Both films were exposed through positive color transparencies using the 500-watt projector of Example II, at a distance of 15 inches, usually for a 2-minute exposure.

The films were processed by soaking in water for 2 minutes, treating for 10 seconds in a 0.1% solution of potassium persulfate, 5 seconds water rinse, 1-minute treatment in the developer of Example II, 30 seconds treatment in a 2% solution of potassium persulfate, 5 seconds water rinse, 20 seconds treatment in the developer solution, 30 seconds in the 2% potassium persulfate solution, and a 5-minute water wash. Full color positive images resulted with better picture quality being obtained from the film having the opaque support and the double coating of the yellow dispersion.

It is to be noted that the yellow dispersion did not contain the novel, nonmigratory photoreducible dyes of this invention. Phenanthrenequinone is a very useful blue-sensitive photoinitiator and, because of its very low water solubility, presents no problems due to migration. In a test as described in Example I this initiator had a dye circle with a diameter of 0.4 cm. It is in the longer wavelength portion of the visible spectrum where the photoreducible dyes are particularly needed to provide the required spectral response.

The principle utility of the present invention is found in such elements as disclosed in Example V wherein multilayer color photographic elements can be exposed and processed to give clean separation of the several color record layers. The nonmigratory photoreducible dye initiators are especially advantageous for their ability to resist migration during coating from aqueous solutions. Elimination of silver halide from these dispersions and elements represents a very definite economic advantage in the face of continuing rising prices of silver. The reduced oxygen sensitivity in the heterogeneous system provides advantages over other photopolymerizable systems which are homogeneous. Reduced sensitivty to oxygen also may explain, in part, the ability of this heterogeneous system to produce continuous tone reproduction. This reproduction of continuous tones is probably dependent, also, on the variation of sensitivity between dispersed droplets of different sizes. (The preferred dispersion contains droplets having a size of about 0.1 to 0.5 micron.) This ability of the heterogeneous system to produce continuous tone images makes possible the use of photopolymerization in conventional photographic materials, particularly for contact or enlargement papers. Another advantage is concerned with the light scattering effects. Since the droplet size is such that light scattering appears to occur within the matrix, it is possible to have more absorption of light with a given concentration of initiator.

In the specific applications for color reproduction of the images, as disclosed in the examples, these embodiments employ a combination of dye-bleached and color-coupler destruction. The initial dye-bleached image is replaced by a permanent color formed image, color formation being modulated by the photopolymerization initiated during photobleaching. In principle, the system is faster than either dye-bleach or color-coupler destruction methods by virtue of the increased amplification which results on photopolymerization (i.e., a single photon can initiate photopolymerization to form a chain which can prevent more than one color-former molecule from coupling with developer). In this embodiment, as an initiator dye is bleached, the light attenuation by that dye decreases. For this reason, the system seems to have a wide exposure latitude.

The heterogeneous photopolymerization system of this invention shows no significant low-intensity reciprocity failure, probably because of its realtive insensitivity to oxygen. Also, it has been found that stability is satisfactory, both of the raw stock (unexposed material) and the final images that are produced by this process.

An especially novel feature of the present invention is that the photoreducible initiator dyes have been made nonmigratory by methods which have not caused major changes in either their light sensitivity or in the wave length at which the sensitivity peaks are found. Thus the dyes have been made non-migratory by the employment of short-chain (up to 4 to 6 carbon atoms) hydrocarbon substituents in the chromophoric part of the molecule or long chain hydrocarbon radicals substituted on the nonchromophoric part of the molecule.

The embodiments of the invention in which an exclusive property or privilege is claimed are defined as follows:

1. A photopolymerizable element comprising a support and a photopolymerizable layer comprising a continuous phase of an organic macromolecular polymer dispersion medium and a dispersed phase in said medium, said dispersed phase containing:

(1) at least one ethylenically unsaturated compound having a boiling point above 100° C. at normal pressure, being capable of forming a high polymer by free-radical initiated, chain-propagating addition polymerization, and (2) at least one but not all of the ingredients of a color image-yielding composition, and in reactive association with ingredients (1) and (2), a free-radical generating photoinitiator composition comprising (a) a nonmigratory photoreducible dye selected from the group consisting of thiazine, phenosafranine, phenoxazine, fluorescein, and acridine dyes, said dye being more soluble in ingredient (1) than in said dispersion medium, the dye being characterized by the dye nucleus (i) containing an alkyl radical of 5–20 carbon atoms on the nonchromophoric part of the molecule, (ii) containing up to 4 alkyl radicals of up to 6 carbon atoms in the chromophoric part of the molecule, (iii) having attached thereto a chain of atoms of an addition polymer, or (iv) being recurring in a condensation polymer, the recurring nuclei being linked by short hydrocarbon chains; and (b) a free-radical producing agent activated only by the excited state of said photoreducible dye.

2. A photopolymerizable element comprising a support and a photopolymerizable layer comprising a continuous phase of an organic macromolecular polymer dispersion medium and a dispersed phase in said medium, said dispersed phase containing:

(1) at least one ethylenically unsaturated compound having a boiling point above 100° C. at normal pressure, being capable of forming a high polymer by free-radical initiated, chain-propagating addition polymerization, and (2) at least one but not all of the ingredients of a color image-yielding composition, said ingredients being incapable of forming a color image alone, and in reactive association with ingredients (1) and (2), a free-radical generating photoinitiator composition comprising (a) a nonmigratory photoreducible dye selected from the group consisting of thiazine, phenosafranine, phenoxazine, fluorescein, and acridine dyes, said dye being more soluble in ingredient (1) than in said dispersion medium, and having a dye circle diameter less than 1.2 cm. when two microliters of a 0.001 M solution of dye in methanol are placed on a layer of set gelatin 0.5 cm. thick and allowed to stand for 18 hours at 25° C., the dye being characterized by the dye nucleus (i) containing an alkyl radical of 5–20 carbon atoms on the non-chromophoric part of the molecule, (ii) contatining up to 4 alkyl radicals of up to 6 carbon atoms in the chromophoric part of the molecule, (ii) containing up to 4 alkyl radicals of up atoms of an addition polymer, or (iv) being recurring in a condensation polymer, the recurring nuclei being linked by short hydrocarbon chains; and (b) a free-radical producing agent activated only by the excited state of said photo-reducible dye.

3. An element according to claim 2 wherein said organic macromolecular polymer is gelatin.

4. An element according to claim 2 wherein said nonmigratory, photoreducible dye contains an alkyl radical of 5 to 20 carbon atoms on the non-chromophoric part of the molecule.

5. An element according to claim 2 wherein said dye is 3,7 - di(N - azobicyclo-[3,2,2]-nonyl)phenazathionium bromide.

6. An element according to claim 2 wherein said dye is poly[3,7-di-N,N′(N,N′-diethylhexanediamine-1,6)phenazathionium bromide].

7. An element according to claim 2 wherein said dye is N,N,N′,N′-tetramethyl-4′-dodecylphenosafranine.

8. An element according to claim 2 wherein said free radical producing agent is selected from the group consisting of $CBr_4$, triethanolamine, N-phenylglycine and 5,5-dimethyl-1,3-cyclohexanedione.

9. An element according to claim 1 wherein the ingredients of the composition specified in paragraph (2) are (i) a color-former, color developer and an oxidizing agent, (ii) a diazonium salt and an azo dye coupler, (iii) a leuco dye and an oxidizing agent, or (iv) a dye and a bleaching agent.

10. A multilayer photopolymerizable element for producing multicolor reproductions which comprises a support and three superimposed layers where each layer comprises a continuous phase of an organic macromolecular polymer dispersion medium and a dispersed phase containing:

(1) at least one ethylenically unsaturated compound having a boiling point above 100° C. at normal pressure, being capable of forming a high polymer by free-radical initiated, chain-propagating addition polymerization, and (2) at least one of the ingredients of a color image-yielding composition, said ingredients being incapabale of forming a color image alone, and in reactive association with ingredients (1) and (2), a free-radical generating photoinitiator composition comprising (a) a nonmigratory photoreducible dye selected from the group consisting of thiazine, phenosafranine, phenoxazine, fluorescein, and acridine dyes, said dye being more soluble in ingredient (1) than in said dispersion medium, the dye being characterized by the dye nucleus (i) containing an alkyl radical of 5–20 carbon atoms on the nonchromophoric part of the molecule, (ii) containing up to 4 alkyl radicals of up to 6 carbon atoms in the chromophoric part of the molecule, (iii) having attached thereto a chain of atoms of an addition polymer, or (iv) being recurring in a condensation polymer, the recurring nuclei being linked by short hydrocarbon chains; and (b) a free-radical producing agent activated only by the excited state of said photoreducible dye, said photoreducible dye for each layer being activatable by radiation of a different one of only one of the three primary color regions of the visible spectrum and said dispersed phase of each of said layers containing ingredients of a color image-yielding composition that yields a layer complementary in color to that portion of said spectrum that activates said nonmigratory dye for the particular layer.

11. An element according to claim 2 wherein said nonmigratory, photoreducible dye contains up to 4 alkyl radicals of up to 6 carbon atoms symmetrically located on the chromophoric part of the dye molecule.

12. An element according to claim 2, wherein said dye is N,N,N′,N′-tetra-n-butylthionine.

References Cited

UNITED STATES PATENTS

| | | | |
|---|---|---|---|
| 3,393,041 | 7/1968 | Verbrugghe et al. | 96—74 |
| 3,418,118 | 12/1968 | Thommes et al. | 96—115X |
| 3,451,820 | 6/1969 | Umberger | 976—74X |

DAVID KLEIN, Primary Examiner

U.S. Cl. X.R.

96—115

PO-1050
(5/69)

UNITED STATES PATENT OFFICE
CERTIFICATE OF CORRECTION

Patent No. 3,579,339 Dated May 18, 1971

Inventor(s) Catherine Teh-lin Chang & Peter Walker

It is certified that error appears in the above-identified patent and that said Letters Patent are hereby corrected as shown below:

Column 1, line 15, change "oragnic" to --organic--.

Column 1, line 19, after "triacrylate" insert --)--.

Column 5, line 37, change "di-n-heptylamine" to --methyl-n-octylamine--.

Column 7, line 36, change "silghtly" to --slightly--.

Column 8, line 5, change

"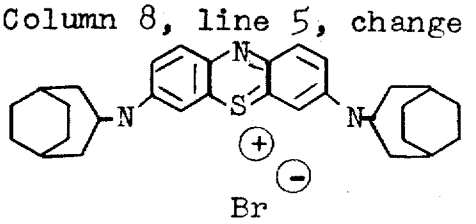" to

--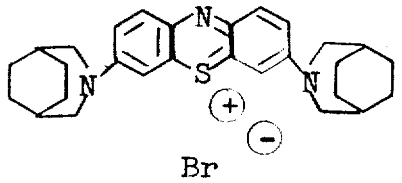--

Column 13, line 35, change "contatining" to --containing--;

line 37, change "(ii) containing up to 4 alkyl radicals of up" to --(iii) having attached thereto a chain of--

Signed and sealed this 18th day of January 1972.

(SEAL)
Attest:

EDWARD M.FLETCHER,JR.
Attesting Officer

ROBERT GOTTSCHALK
Acting Commissioner of Patents